US012562697B2

(12) United States Patent
Linghu

(10) Patent No.: US 12,562,697 B2
(45) Date of Patent: Feb. 24, 2026

(54) DRIVING CIRCUIT FOR AUDIO POWER AMPLIFIER AND ELECTRONIC DEVICE

(71) Applicant: AAC Microtech (Changzhou) Co., Ltd., Changzhou (CN)

(72) Inventor: Ronglin Linghu, Changzhou (CN)

(73) Assignee: AAC Microtech (Changzhou) Co., Ltd., Changzhou (CN)

( * ) Notice: Subject to any disclaimer, the term of this patent is extended or adjusted under 35 U.S.C. 154(b) by 378 days.

(21) Appl. No.: 18/335,988

(22) Filed: Jun. 15, 2023

(65) Prior Publication Data

US 2024/0136986 A1      Apr. 25, 2024
US 2024/0235499 A9      Jul. 11, 2024

Related U.S. Application Data

(63) Continuation of application No. PCT/CN2022/136216, filed on Dec. 2, 2022.

(30) Foreign Application Priority Data

Oct. 20, 2022      (CN) .......................... 202211288048.8

(51) Int. Cl.
*H03F 3/213*          (2006.01)
*H04R 5/04*          (2006.01)

(52) U.S. Cl.
CPC .............. *H03F 3/213* (2013.01); *H04R 5/04* (2013.01); *H03F 2200/03* (2013.01)

(58) Field of Classification Search
None
See application file for complete search history.

(56) References Cited

U.S. PATENT DOCUMENTS

| | | | |
|---|---|---|---|
| 7,019,622 B2 * | 3/2006 | Orr .......................... | G08B 6/00 |
| | | | 340/407.1 |
| 11,277,084 B2 * | 3/2022 | Sadineni ................. | G06F 3/016 |
| 2008/0151975 A1 * | 6/2008 | Cheng .................... | G10L 19/00 |
| | | | 375/219 |

* cited by examiner

*Primary Examiner* — Paul W Huber
(74) *Attorney, Agent, or Firm* — Wiersch Law Group

(57) ABSTRACT

A driving circuit for an audio power amplifier and an electronic device are provided. The driving circuit includes an audio codec, an audio power amplifier (PA), a power management integrated circuit (PMIC), a transistor, a speaker, and a motor. The transistor is connected in series with the motor to form a combined body, the speaker is connected in parallel with the combined body to form a two-in-one device, the audio PA is connected in series with the two-in-one device, the PMIC is connected in series with the two-in-one device, and the audio codec is connected in series with the audio PA. In the technical solutions provided in embodiments of the disclosure, a power amplifier can drive both the motor and the speaker, so that a power amplifier may be omitted and the power consumption and cost of the electronic equipment may be reduced.

10 Claims, 3 Drawing Sheets

DRIVING CIRCUIT FOR AUDIO POWER AMPLIFIER AND ELECTRONIC DEVICE

CROSS REFERENCE TO RELATED APPLICATIONS

The present application is a continuation of PCT Patent Application No. PCT/CN2022/136216, filed Dec. 2, 2022, which claims priority to Chinese patent application No. 202211288048.8, filed Oct. 20, 2022, each of which is incorporated by reference herein in its entirety.

TECHNICAL FIELD

The various embodiments described in this document relate in general to the technical field of acoustics, and more specifically to a driving circuit for an audio power amplifier and an electronic device.

BACKGROUND

A driving circuit for an audio power amplifier is an important part of an audio system. The driving circuit generally adopts a multi-stage amplifier to amplify relatively small audio signals, thereby providing larger gain and increasing power of the audio signal. Thereafter, an output stage can provide enough driving force to a load to realize power amplification.

In the driving circuit including the audio power amplifier, the audio power amplifier processes audio signals and a motor power amplifier processes motor signals. That is, the driving circuit includes two power amplifiers, which makes the power consumption and cost of an electronic device relatively high.

SUMMARY

In view of the above, a driving circuit for an audio power amplifier and an electronic device are provided, which can reduce the power consumption of the electronic device and save cost of the electronic device.

According to one aspect, in some embodiments, a driving circuit for an audio power amplifier is provided and includes an audio codec, an audio power amplifier (PA), a power management integrated circuit (PMIC), a transistor, a speaker, and a motor. The transistor is connected in series with the motor to form a combined body, the speaker is connected in parallel with the combined body to form a two-in-one device, the audio PA is connected in series with the two-in-one device, the PMIC is connected in series with the two-in-one device, and the audio codec is connected in series with the audio PA.

In some embodiments, the transistor being connected in series with the motor to form the combined body, the speaker being connected in parallel with the combined body to form the two-in-one device, and the PMIC being connected in series with the two-in-one device includes: the transistor has an emitter connected with the motor, has a collector connected with the speaker and the audio PA, and has a base connected with the PMIC.

In some embodiments, the audio codec includes a digital signal processing (DSP) module, and the DSP module is connected with the PMIC.

In some embodiments, the audio power amplifier is configured to drive the two-in-one device.

In some embodiments, the PMIC is configured to receive a first motor operation synchronization signal and a second motor operation synchronization signal, and to send, in response to at least one of the first motor operation synchronization signal and the second motor operation synchronization signal, a trigger level signal to the base of the transistor for the transistor to be turned on in response to the trigger level signal.

In some embodiments, the driving circuit further includes a receiver, and the receiver is connected in series with the audio codec.

In some embodiments, the motor comprises an X-axis motor or a Z-axis motor.

In some embodiments, the audio codec is configured to receive a first voice signal, to process the first voice signal to generate a second voice signal, and to send the second voice signal to a receiver for the receiver to operate according to the second voice signal.

In some embodiments, the audio codec is configured to receive a first motor signal and a first music signal, to process the first motor signal and the first music signal to generate a second motor signal and a second music signal, and to send the second motor signal and the second music signal to an audio PA; the audio PA is configured to send the second motor signal and the second music signal to the two-in-one device; and the two-in-one device is configured to operate according to the second motor signal and the second music signal.

According to another aspect, an electronic device is provided. The electronic device includes the driving circuit for the audio power amplifier described in the foregoing aspect.

In the technical proposal provided in the embodiment of the disclosure, the driving circuit includes the audio codec, the audio PA, the PMIC, the transistor, the speaker, and the motor. The transistor is connected in series with the motor to form the combined body, the speaker is connected in parallel with the combined body to form the two-in-one device, the audio PA is connected in series with the two-in-one device, the PMIC is connected in series with the two-in-one device, and the audio codec is connected in series with the audio PA. In the technical proposal provided in the embodiments of the disclosure, one power amplifier is adopted to drive both the motor and the speaker, so that a power amplifier may be omitted and the power consumption and cost of the electronic device may be reduced.

BRIEF DESCRIPTION OF THE DRAWINGS

In order to explain technical aspects of the embodiments of the present disclosure more clearly, the drawings required for use in the description of the embodiments will be briefly described below. It will be apparent that the drawings described below are only some embodiments of the disclosure, and other drawings may be obtained from these drawings without any creative effort by those of ordinary skill in the art.

DETAILED DESCRIPTION OF THE EMBODIMENTS

In order to better understand the technical proposal of the present disclosure, the embodiments of the present disclosure are described in detail below with reference to the accompanying drawings.

It is to be noted that the described embodiments are only part of embodiments and not all embodiments of the disclosure. Based on the embodiments in the disclosure, all other embodiments obtained without creative effort by those of ordinary skill in the art fall within the scope of protection of the disclosure.

Terms used in embodiments of the disclosure are for the purpose of describing specific embodiments only and are not intended to limit the disclosure. Singular forms "an", "said", and "the" as used in embodiments of the disclosure and in the appended claims are also intended to include a plurality of forms, unless the context clearly dictates otherwise.

It can be understood that the term "and/or" used herein is merely an association relationship that describes an associated object, indicating that there can be three relationships. For example, the expression "A and/or B" may include three cases: A exists alone, A and B exist at the same time, and B exists alone. In addition, the character "/" herein generally indicates that related objects are a kind of "or" relationship.

Figure 1:
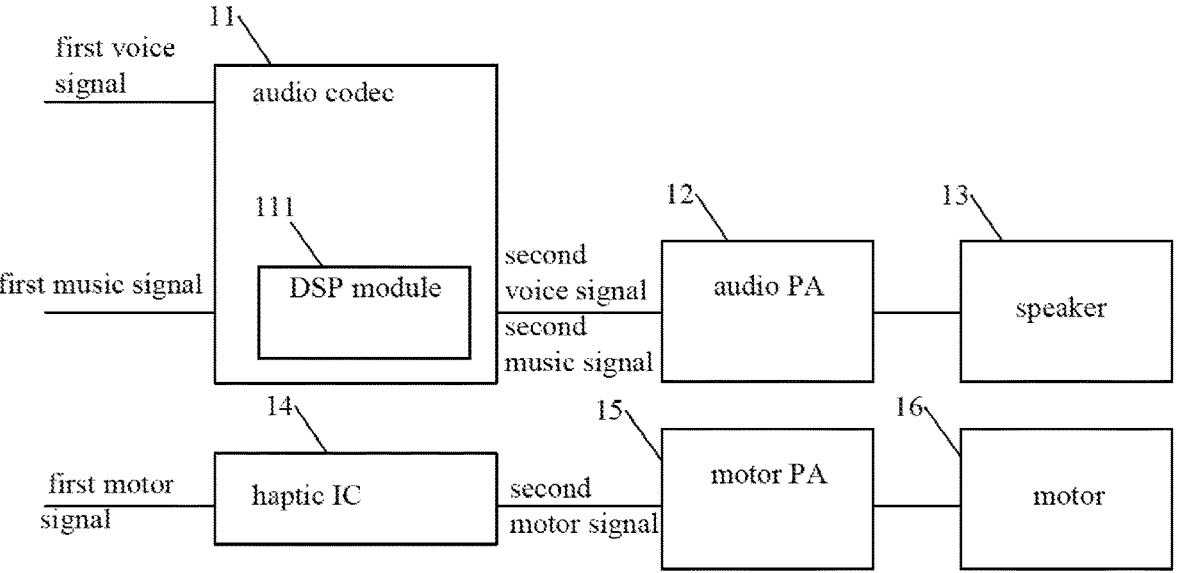
FIG. 1 is a schematic diagram of a driving circuit for an audio power amplifier according to embodiments of the disclosure.

Embodiments of the disclosure provide a driving circuit for an audio power amplifier. FIG. 1 is a schematic diagram of a driving circuit for an audio power amplifier according to embodiments of the disclosure. As shown in FIG. 1, the driving circuit includes an audio codec 11, an audio power amplifier (PA) 12, a speaker 13, a haptic integrated circuit (IC) 14, a motor PA 15, and a motor 16. The audio codec 11 includes a digital signal processing (DSP) module 111.

The audio codec 11 is connected with the audio PA 12, and the audio PA 12 is connected with the speaker 13. The haptic IC 14 is connected with the motor PA 15, and the motor PA 15 is connected with the motor 16.

The audio codec 11 is configured to receive a first voice signal and a first music signal, to process the first voice signal and the first music signal to generate a second voice signal and a second music signal, and to transmit the second voice signal and the second music signal to the audio PA 12. The audio PA 12 is configured to drive the speaker 13 to operate according to the second voice signal and the second music signal.

The haptic IC 14 is configured to receive a first motor signal, to process the first motor signal to generate a second motor signal, and to transmit the second motor signal to the motor PA 15. The motor PA 15 is configured to drive the motor 16 to operate according to the second motor signal.

In some embodiments of the present disclosure, the motor 16 includes an X-axis motor.

Figure 2:
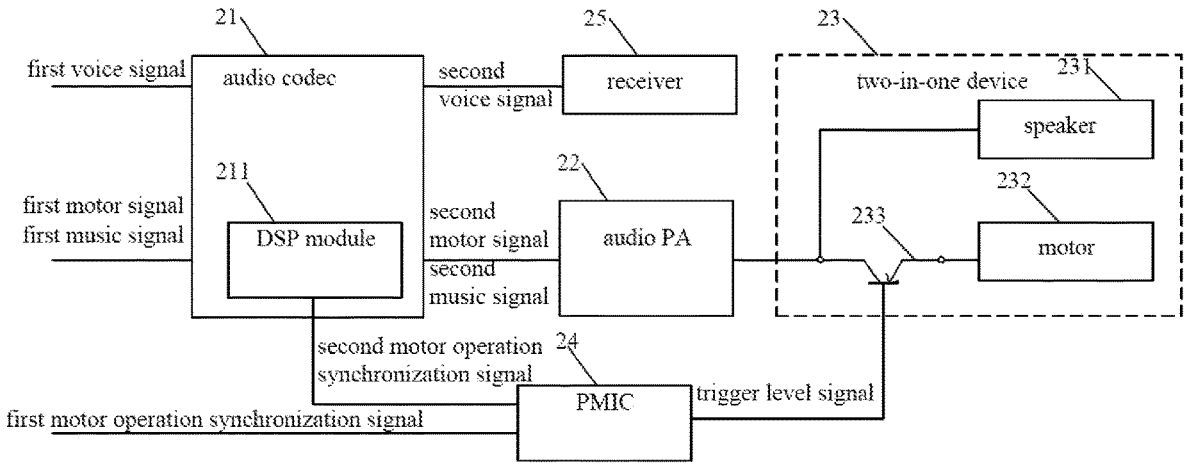
FIG. 2 is a schematic diagram of a driving circuit for an audio power amplifier according to other embodiments of the disclosure.

Embodiments of the disclosure further provide a driving circuit including an audio PA. FIG. 2 is a schematic diagram of a driving circuit for an audio power amplifier according to other embodiments of the disclosure. As shown in FIG. 2, the driving circuit includes an audio codec 21, an audio PA 22, a power management IC (PMIC) 24, a transistor 233, a speaker (SPK) 231, and a motor 232.

The transistor 233 is connected in series with the motor 232 to form a combined body. The speaker 231 is connected in parallel with the combined body to form a two-in-one device 23. The audio PA 22 is connected in series with the two-in-one device 23. The PMIC 24 is connected in series with the two-in-one device 23. The audio codec 21 is connected in series with the audio PA 22.

Specifically, an emitter of the transistor 233 is connected to the motor 232, a collector of the transistor 233 is connected to the speaker 231 and the audio PA 22, and a base of the transistor 233 is connected to the PMIC 24.

In some embodiments of the present disclosure, the audio codec 21 includes a DSP module 211. The DSP module 211 is connected with the PMIC 24.

In some embodiments of the present disclosure, the audio PA 22 is configured to drive the two-in-one device 23.

In some embodiments of the present disclosure, the PMIC 24 is configured to receive a first motor operation synchronization signal and a second motor operation synchronization signal, and to send, in response to the first motor operation synchronization signal and/or the second motor operation synchronization signal, a trigger level signal to the base of the transistor 233 for the transistor 233 to be turned on in response to the trigger level signal.

In some embodiments of the present disclosure, the driving circuit further includes a receiver (RCV) 25.

The receiver 25 is connected in series with the audio codec 21.

In some embodiments of the present disclosure, the motor 232 includes an X-axis motor or a Z-axis motor. An operating frequency of the motor 232 is within a set frequency range, for example, the set frequency range is +/−30 HZ near a set frequency F0, that is, [set frequency F0-30 HZ, set frequency F0+30 HZ].

In some embodiments of the present disclosure, the audio codec 21 is configured to receive the first voice signal, to process the first voice signal to generate a second voice signal, and to send the second voice signal to the receiver 25 for the receiver 25 to operate according to the second voice signal.

In some embodiments of the present disclosure, the audio codec 21 is configured to receive a first motor signal and a first music signal, to process the first motor signal and the first music signal to generate a second motor signal and a second music signal, and to send the second motor signal and the second music signal to an audio PA 22. The audio PA 22 is configured to send the second motor signal and the second music signal to the two-in-one device 23, and the two-in-one device 23 is configured to operate according to the second motor signal and the second music signal.

Specifically, the two-in-one device 23 includes the speaker 231 and the motor 232. The speaker 231 is configured to operate according to the second music signal and the motor 232 is configured to operate according to the second motor signal.

In the technical proposal provided in some embodiments of the present disclosure, the audio PA 22 can drive both the speaker 231 and the motor 232.

In the technical proposal provided in some embodiments of the present disclosure, the trigger level signal of the transistor 233 is controlled through a motor operation synchronization signal. The motor operation synchronization signal (i.e., the first motor operation synchronization signal) may be generated when the motor signal and the music signal are synthesized, or may be generated in any detection node (including algorithm processing node or hardware processing nide, for example, the second motor operation synchronization signal) of the transmission path of a synthesized signal.

In the technical proposal provided in the embodiment of the disclosure, the driving circuit includes the audio codec, the audio PA, the PMIC, the transistor, the speaker, and the motor. The transistor is connected in series with the motor to form the combined body, the speaker is connected in parallel with the combined body to form the two-in-one device, the audio PA is connected in series with the two-in-one device, the PMIC is connected in series with the two-in-one device, and the audio codec is connected in series with the audio PA. In the technical proposal provided in the embodiments of the disclosure, one power amplifier is adopted to drive both the motor and the speaker, so that a power amplifier may be omitted and the power consumption and cost of the electronic device may be reduced.

In the technical proposal provided in an embodiment of the disclosure, the driving circuit including the audio PA can be applied to an electronic device, thereby simplifying the hardware complexity of the signal transmission path of the electronic device. The electronic device includes a mobile phone, a tablet computer, a speaker, a headphone, a wearable device, and so on.

Embodiments of the disclosure provide an electronic device. The electronic device includes a driving circuit including the audio PA.

Figure 3:
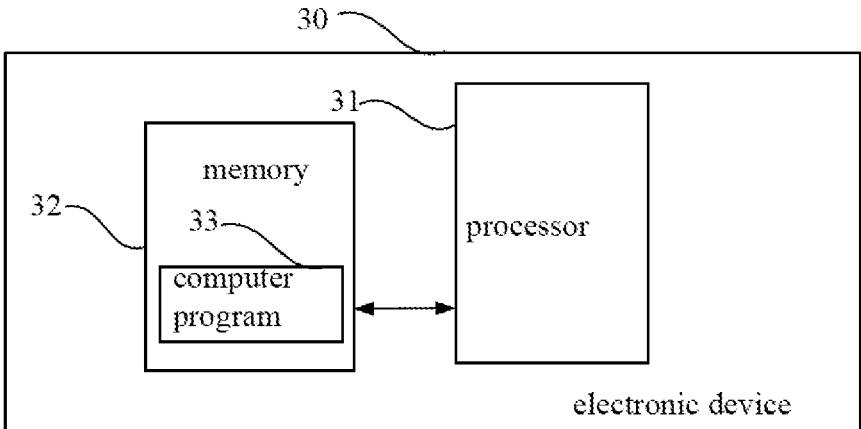
FIG. 3 is a schematic diagram of an electronic device according to embodiments of the disclosure.

FIG. 3 is a schematic diagram of an electronic device according to embodiments of the disclosure. As shown in FIG. 3, the electronic device 30 of embodiments includes a processor 31 and a memory 32. The memory 32 stores a computer program 33 and the computer program 33 is executable on the processor 31.

The electronic device 30 includes, but is not limited to, a processor 31 and a memory 32. Those skilled in the art will appreciate that FIG. 3 is merely an example of an electronic device 30 and does not constitute a limitation to the electronic device 30, and may include more or fewer components than illustrated, or a combination of certain components, or different components. For example, the electronic device may further include an input-output device, a network access device, a bus, and the like.

The processor 31 may be a central processing unit (CPU), another general-purpose processor, a digital signal processor (DSP), an application specific integrated circuit (ASIC), a field-programmable gate array (FPGA), or other programmable logic devices, discrete gates, or transistor logic devices, discrete hardware components, and the like. The general-purpose processor may be a microprocessor or the processor, or may be any conventional processor or the like.

The memory 32 may be an internal storage unit of the electronic device 30 such as a hard disk or memory of the electronic device 30. The memory 32 may also be an external storage device of the electronic device 30, such as a plug-in hard disk, a Smart media card (SMC), a secure digital (SD) card, a flash card, or the like provided on the electronic device 30. Furthermore, the memory 32 may also include both an internal storage unit of the electronic device 30 and an external storage device. The memory 32 is used to store computer programs and other programs and data required by the electronic device. The memory 32 may also be used to temporarily store data that has been output or will be output.

Those skilled in the art will clearly appreciate that, for convenience and conciseness of description, the specific operating processes of the above-described systems, apparatuses and units may refer to the corresponding processes in the foregoing method embodiments, which are repeated herein.

In the implementations of the disclosure, it shall be understood that the above-described systems, apparatuses, and methods disclosed in implementations provided herein may be implemented in other manners. For example, the device/apparatus implementations described above are merely illustrative; for instance, the division of the unit is only a logical function division and there can be other manners of division during actual implementations, for example, multiple units or components may be combined or may be integrated into another system, or some features may be ignored or not performed. In addition, coupling or communication connection between each illustrated or discussed component may be direct coupling or communication connection, or may be indirect coupling or communication connection among devices or units via some interfaces, and may be electrical connection, or other forms of connection.

The units described as separate components may or may not be physically separated, the components illustrated as units may or may not be physical units, that is, they may be in the same place or may be distributed to multiple network elements. All or part of the units may be selected according to actual needs to achieve the purpose of the technical solutions of the implementations.

In addition, the functional units in various implementations of the present disclosure may be integrated into one processing unit, or each unit may be physically present, or two or more units may be integrated into one unit. The above-mentioned integrated unit can be implemented in the form of hardware or a software function unit.

The integrated unit may be stored in a computer-readable memory when it is implemented in the form of a software functional unit. The software functional units are stored in a storage medium and include instructions for causing a computer device (which may be a personal computer, a server, a network device, etc.) or a processor to perform part of the steps of the method described in various embodiments of the disclosure. The storage media described above includes a U disk, a removable hard disk, a read-only memory (ROM), a random access memory (RAM), a magnetic disk, or an optical disk and other media capable of storing program codes.

The foregoing embodiments are merely some embodiments of the disclosure and are not intended to limit the present disclosure. Any modifications, equivalents, modifications, or the like made within the spirit and principles of the present disclosure should be included within the scope of protection of the present disclosure.

What is claimed is:

1. A driving circuit for an audio power amplifier, the driving circuit comprising: an audio codec, an audio power amplifier (PA), a power management integrated circuit (PMIC), a transistor, a speaker, and a motor, wherein
   the transistor is connected in series with the motor to form a combined body, the speaker is connected in parallel with the combined body to form a two-in-one device, the audio PA is connected in series with the two-in-one device, the PMIC is connected in series with the two-in-one device, and the audio codec is connected in series with the audio PA.

2. The driving circuit of claim 1, wherein the transistor being connected in series with the motor to form the combined body, the speaker being connected in parallel with the combined body to form the two-in-one device, and the PMIC being connected in series with the two-in-one device comprises:
   the transistor has an emitter connected with the motor, has a collector connected with the speaker and the audio PA, and has a base connected with the PMIC.

3. The driving circuit of claim 1, wherein the audio codec includes a digital signal processing (DSP) module, wherein the DSP module is connected with the PMIC.

4. The driving circuit of claim 1, wherein the audio power amplifier is configured to drive the two-in-one device.

5. The driving circuit of claim 2, wherein the PMIC is configured to receive a first motor operation synchronization signal and a second motor operation synchronization signal, and to send, in response to at least one of the first motor operation synchronization signal and the second motor operation synchronization signal, a trigger level signal to the base of the transistor for the transistor to be turned on in response to the trigger level signal.

6. The driving circuit of claim 1, wherein the driving circuit further includes a receiver, and the receiver is connected in series with the audio codec.

7. The driving circuit of claim 1, wherein the motor comprises an X-axis motor or a Z-axis motor.

8. The driving circuit of claim 6, wherein the audio codec is configured to receive a first voice signal, to process the first voice signal to generate a second voice signal, and to send the second voice signal to a receiver for the receiver to operate according to the second voice signal.

9. The driving circuit of claim 1, wherein:

the audio codec is configured to receive a first motor signal and a first music signal, to process the first motor signal and the first music signal to generate a second motor signal and a second music signal, and to send the second motor signal and the second music signal to an audio PA;

the audio PA is configured to send the second motor signal and the second music signal to the two-in-one device; and the two-in-one device is configured to operate according to the second motor signal and the second music signal.

10. An electronic device, comprising a driving circuit, the driving circuit comprising: an audio codec, an audio power amplifier (PA), a power management integrated circuit (PMIC), a transistor, a speaker, and a motor, wherein the transistor is connected in series with the motor to form a combined body, the speaker is connected in parallel with the combined body to form a two-in-one device, the audio PA is connected in series with the two-in-one device, the PMIC is connected in series with the two-in-one device, and the audio codec is connected in series with the audio PA.

* * * * *